(12) United States Patent
Hubbard et al.

(10) Patent No.: US 9,447,492 B2
(45) Date of Patent: Sep. 20, 2016

(54) CONDUCTIVE ANTI-REFLECTIVE FILMS

(76) Inventors: Graham J. Hubbard, Wantage (GB);
Keith P. Parsons, Swindon (GB);
Timothy N. Wright, Wantage (GB)

( * ) Notice: Subject to any disclaimer, the term of this patent is extended or adjusted under 35 U.S.C. 154(b) by 1084 days.

(21) Appl. No.: 13/152,523

(22) Filed: Jun. 3, 2011

(65) Prior Publication Data

US 2012/0305521 A1    Dec. 6, 2012

(51) Int. Cl.
*C23C 14/08*    (2006.01)
*G02B 1/118*    (2015.01)
*H01L 31/0236*    (2006.01)
*H01L 31/0392*    (2006.01)

(52) U.S. Cl.
CPC ............. *C23C 14/086* (2013.01); *G02B 1/118* (2013.01); *H01L 31/02366* (2013.01); *H01L 31/0392* (2013.01); *Y02E 10/50* (2013.01)

(58) Field of Classification Search
None
See application file for complete search history.

(56) References Cited

U.S. PATENT DOCUMENTS

| | | |
|---|---|---|
| 6,478,932 B1 | 11/2002 | Chu et al. |
| 6,603,085 B2 | 8/2003 | Oya et al. |
| 6,677,703 B2 | 1/2004 | Ito et al. |
| 7,014,912 B2 * | 3/2006 | Suzuki et al. ................ 428/208 |
| 7,151,532 B2 | 12/2006 | Schulz |
| 7,551,356 B2 | 6/2009 | Noguchi et al. |
| 2004/0027339 A1 | 2/2004 | Schulz |
| 2004/0229051 A1 | 11/2004 | Schaepkens et al. |
| 2007/0091076 A1 | 4/2007 | Schulz |
| 2007/0216997 A1 * | 9/2007 | Noguchi et al. .............. 359/359 |
| 2007/0289874 A1 * | 12/2007 | Masuda et al. ............... 205/171 |
| 2010/0025638 A1 * | 2/2010 | Murota et al. ................ 252/512 |
| 2010/0035163 A1 | 2/2010 | Kobrin |
| 2010/0243427 A1 | 9/2010 | Kozlowski et al. |
| 2010/0259823 A1 | 10/2010 | Xi et al. |
| 2012/0270013 A1 * | 10/2012 | Kim et al. .................... 428/141 |

FOREIGN PATENT DOCUMENTS

| | | |
|---|---|---|
| EP | 2 045 368 | 4/2009 |
| EP | 2 210 970 | 7/2010 |
| EP | 2 293 119 | 3/2011 |
| EP | 2 474 843 | 7/2012 |
| WO | 2011/027518 | 3/2011 |
| WO | 2011/027909 | 3/2011 |

OTHER PUBLICATIONS

Yanagishita et al, Antireflection Polymer Hole Array Strucutre by Imprinting Using Metal Molds from Anodic Porous Alumina, May 2008, Applied Physics Express, vol. 1, pp. 1-3.*

* cited by examiner

*Primary Examiner* — Stephanie Duclair
(74) *Attorney, Agent, or Firm* — Carmody Torrance Sandak & Hennessey LLP

(57) ABSTRACT

A method of applying a transparent conductive film to a polymeric substrate having a desired textured therein is provided. The method includes the steps of providing a polymeric material having a texture disposed therein and conformally applying a transparent conductive material to the molded polymeric material to produce a conformal transparent conductive film thereon. The conformal transparent conductive film has a texture corresponding to the texture of the polymeric material and has a period that is not larger than the wavelength of visible light, whereby the conformal transparent conductive film is antireflective.

2 Claims, No Drawings

CONDUCTIVE ANTI-REFLECTIVE FILMS

FIELD OF THE INVENTION

The present invention relates generally to methods of forming anti-reflective transparent conductive films.

BACKGROUND OF THE INVENTION

Polymer molding materials are widely used to make a wide variety of materials, including for example various display devices, and, it is often desirable and/or necessary to provide an anti-reflective layer or textured surface therein to inhibit reflected light to ensure satisfactory visibility. Various methods are used to produce such anti-reflective layers and provide a multi-layered film composed of dielectrics having different refractive indices.

Anti-reflection films improve transmission and contrast because they limit saturation of a display by ambient light. By improving display brightness, anti-reflective films can help to reduce power requirements and thereby extend battery life. In addition, minimal reflection ensures that viewers can read their screens more easily, even in bright conditions. Improvement of the brightness, contrast and readability of mobile color displays in PDAs and mobile phones is critical while minimizing power demands.

There is also often a requirement for display films to be electrically conductive in addition to being transparent. This is often for antistatic requirements or to introduce electromagnetic interference (EMI) shielding. Indium tin oxide (ITO) is an example of a transparent conductive material and is one of the materials that makes the magic of flat panel displays (monitors, televisions, etc.) possible. When sputtered onto a solid substrate in a thin layer, it acts as a transparent conductive film.

ITO coatings have found many applications in the display and optical coatings industries as transparent conductors. ITO is optically transparent like glass, but unlike glass it is electrically conducting and, therefore, capable of carrying an electric current. ITO films are used in numerous electronic devices, such as liquid crystal displays (LCDs) and plasma television screens. More recently, ITO films have also been used as conductive coatings on photovoltaic cells, commonly called solar cells. Processing conditions for ITO are important because they can significantly affect film conductivity. The key is to increase conductivity while retaining transparency in the visible spectrum. The conductivity creates absorption in the infrared due to free carriers.

A problem with the use of transparent conductive materials such as ITO, is that due to the very high refractive index of ITO, such ITO coatings are highly reflective, which restricts viewability. In addition, high reflection implies low transmission from a free standing film, which manifests itself as low brightness for the display. Therefore, a requirement for ITO layers has serious implications for both viewer comfort and brightness (power requirements) of a display.

Various processes have been suggested to get around this problem by using multilayer coatings to provide some level of anti-reflection performance. However, these multilayer coatings are often mixed metal oxides to provide layers of varying refractive index, tuned to provide optimal reflection and transmission characteristics for the total construction. This can be an expensive and time consuming process. Thus, it would be desirable to provide a method of making a transparent conductive oxide coating, such as an ITO coating, itself anti-reflective without the need for additional layers.

SUMMARY OF THE INVENTION

It is an object of the present invention to make a transparent conductive oxide material anti-reflective.

It is another object of the present invention to make a transparent conductive oxide material anti-reflective without the need for additional layers.

It is still another object of the present invention to provide an easier method for providing a transparent conductive anti-reflective layer on a substrate.

To that end, the present invention relates generally to a method of applying a transparent conductive film to a polymeric substrate having a desired textured therein, the method comprising the steps of:

a) providing a polymeric material having a texture disposed therein; and b) conformally applying a transparent conductive oxide material to the polymeric material to produce a conformal transparent conductive film thereon;

wherein the conformal transparent conductive film has a texture corresponding to the texture of the polymeric material and wherein the texture has a period that is not larger than the wavelength of visible light, whereby the conformal transparent conductive film is anti-reflective.

DETAILED DESCRIPTION OF THE PREFERRED EMBODIMENTS

The present invention relates to an anti-reflective layer (anti-reflective film) formed on the surface of a polymer material which reduces reflection in the visible light range, a production method thereof and a transparent conductive film that is then deposited thereon.

Indium oxide is an example of a transparent ceramic material and, although a semiconductor, is not a particularly conducting material because it lacks free electrons. Electrons are generally added by doping with a similar element but one that has one more electron than the base material. Thus, in the case of indium oxide, the indium oxide is doped with tin (usually about 5-10%), and becomes conducting while remaining transparent. Other transparent conductive materials include metal oxides and metal oxides doped with one or more metals. Examples of such metal oxides and doped metal oxides include doped indium oxide, tin oxide, doped tin oxide, zinc oxide, aluminum zinc oxide, doped zinc oxide, ruthenium oxide, and doped ruthenium oxide, by way of example and not limitation. A preferred transparent conductive material is tin doped indium oxide, otherwise known as indium tin oxide (ITO).

ITO can be applied via physical vapor deposition, including vacuum coating or sputtering, to a wide range of glass and plastic substrates to make transparent conducting layers for electromagnetic compatibility (EMC) and anti-static applications. Semiconductor is a term that is inclusive of elements or compounds of elements that occur close to the metal/insulator boundary across the periodic table. While commonly silicon and germanium are the semiconductors that are used in microelectronics, there are also various compound semiconductors, formed from elements across the metal/insulator boundary, including materials such as GaAs and InSb, which are not typically transparent in the visible light spectrum. However, several oxide semiconductors (such as oxides of indium, tin or zinc) are transparent in the visible light spectrum and of these, indium oxide is most often used for industrial applications.

There is an upper limit on the speed with which electrons can respond to electric or magnetic fields. The electron density in ITO is not as high as it would be in a metal, which means that this response limit is in the infrared spectrum for ITO. The consequence is that ITO is transparent in the visible spectrum but becomes conducting (and thus reflecting/absorbing) in the infrared spectrum. This means that that it is conducting at frequencies in the infrared region and below and insulating at the frequencies of visible light. Therefore, ITO is transparent to visible light but is still electrically conducting at the frequencies of interest for EMC shielding and anti-static applications.

Coatings of ITO are typically deposited by means of physical vapor deposition, preferably vacuum coating, including evaporation and sputtering techniques and the size of the vacuum chamber controls the size of the substrate that can be coated. To get a uniform coating on a large area, a sputtering process is preferred. A sputtering source gives a wide linear source of ITO, and this, combined with a linear motion, provides good uniform coatings.

However, as noted above, a problem with the use of transparent conductive materials, such as ITO, is that due to the very high refractive index of ITO, such ITO coatings are highly reflective, which restricts viewability. Thus, it is desirable to provide a method of making the ITO coating itself anti-reflective.

Nanostructures, including "Moth Eye" coatings and porous alumina films provide anti-reflection by means of surface modulation such that a graded refractive index coating is obtained.

Moth Eye (or subwavelength) coatings have been developed for achieving the increasingly high-performance requirements of anti-reflective surfaces. The surface of a moth's eye is covered with an array of conical protuberances approximately 200 nm high separated by approximately 200 nm. Thus a moth-eye structure can create what is effectively a gradient-index film from a material of uniform retractive index, and various methods are used to produce such moth-eye structures.

Nano-structures are invisible to the human eye and are used to modify light in optical systems to improve brightness, modify viewing angles and provide outstanding antiglare and anti-reflection characteristics. Thus, another approach for achieving a suitable anti-reflective surface involves the use of films incorporating such nano-structures. For example, a porous alumina structure may be used to create a molded anti-reflective polymer material, as described for example in copending U.S. patent application Ser. No. 12/834,180 to Hubbard et al., the subject matter of which is herein incorporated by reference in its entirety. The use of such nano-structures allow users of PDAs, cellular phones, GPS navigation systems and other similar devices to view their screens more easily with minimal reflection, even in bright conditions.

The inventors of the present invention have determined that the same graded refractive index effect would also function if it could be applied to an ITO layer. While it is not possible to actually structure a free-standing ITO layer, the inventors of the present invention have found that if an ITO layer can be sputtered or otherwise applied conformally onto an existing anti-reflective nanostructure, then the graded index structure is transferred to the ITO while maintaining the ITO's conductive and transparency properties. The conformally applied ITO coating thus possesses anti-reflective characteristics and shows a higher transmission than can be obtained otherwise with a flat ITO coating, and a brighter display with improved viewing characteristics can be obtained.

Based thereon, in a preferred embodiment, the present invention relates generally to a method of applying a transparent conductive film to a polymeric substrate having a desired textured therein, the method comprising the steps of:

a) providing a polymeric material having a texture disposed therein; and b) conformally applying a transparent conductive material to the polymeric material to produce a conformal transparent conductive film thereon;

wherein the conformal transparent conductive film has a texture corresponding to the texture of the polymeric material and wherein the texture has a period that is not larger than the wavelength of visible light, whereby the conformal transparent conductive film is antireflective.

The polymeric material having the texture disposed therein may comprise moth-eye structures or nano-structures as described above. Other suitable structures that are capable of producing an antireflective coating would also be usable in the present invention and would be known to those skilled in the art.

In one embodiment the polymeric material is molded to create a desired texture therein and various molding processes may be used in the practice of the invention. One suitable process for molding the polymeric material to create the texture therein is described in co-pending U.S. patent application Ser. No. 12/834,180 to Hubbard and comprises the steps of:

a) providing a porous alumina master having a plurality of cylindrical pores dispersed therein, said plurality of cylindrical pores corresponding to projections to be imparted to a surface of a polymeric molding material;

b) disposing the polymeric molding material between a transparent film and the porous alumina master; and c) applying mechanical pressure to roll the porous alumina master into the polymeric molding material, wherein the texture imparted to the polymeric molding material comprises projections corresponding to the cylindrical pores of the porous alumina master.

In this embodiment, the porous alumina master may be prepared by a process comprising the following steps:

a) performing a first stage anodization on an aluminum substrate;

b) oxide etching the alumina substrate;

c) performing a second stage anodization; and d) performing a pore widening treatment, wherein cylindrical pores are created in the porous alumina master.

With a mold produced in accordance with the process described herein, a textured polymeric material, such as a photosensitive resin sheet or other similar material, having the microscopic pattern on the surface can be produced. Thereafter, the ITO or other transparent conductive oxide material may be conformally applied to the surface of the pattern on the photosensitive resin sheet so that the ITO layer is also anti-reflective. The conformal transparent conductive film has a texture corresponding to the texture of the polymeric material and having a period that is not larger than the wavelength of visible light, whereby the conformal transparent conductive film is antireflective In the alternative, the texture imparted to the polymeric material may comprise a moth-eye structure and the ITO or other transparent conductive oxide material may be conformally applied to the surface of the pattern on the polymeric material.

The polymeric material is preferably at least substantially transparent and has sufficient mechanical strength. Materials suitable for forming the polymeric material include acrylic resins, such as polymethyl methacrylate resins, polyethyl methacrylate resins and methyl methacrylate-butyl methacrylate copolymers, polyolefin resins, such as polypropylene resins, polymethyl pentene resins and cyclic polyolefin polymers, thermoplastic polyester resins, such as polycarbonate resins, polyethylene terephthalate resins and polyethylene naphthalate resins, thermoplastic resins, such as polyamide resins, acrylonitrile-styrene copolymers, polyether sulfone resins, polysulfone resins, cellulose resins, vinyl chloride resins, polyether ether ketone resins and polyurethane resins. In addition to polymeric materials, the transparent material may be glass.

In one preferred embodiment, the polymeric material is a photosensitive resin that is curable using actinic radiation. In this embodiment, an actinic radiation curable composition is filled between a mold produced in the manner described above and a transparent sheet, and is cured by exposing the photosensitive resin to actinic radiation, followed by demolding. The curable composition may be filled between the mold and the transparent sheets in various ways known to those skilled in the art. For example, the actinic radiation curable composition may be fed between the mold and the transparent sheet from a nip roll, may be coated onto the mold and then laminated with the transparent sheet, or the pressure and/or heat may be used to roll the porous alumina surface into the photosensitive resin.

In the alternative, the desired texture or steric structure of the mold may be transcribed onto the actinic radiation curable composition, which is then demolded and cured by exposure to actinic radiation.

In either of these processes, the composition may additionally be exposed to actinic radiation after demolding. Specific examples of the source of actinic radiation include visible light sources, UV light sources, electron beams, plasma, and infrared light sources and would generally be well known to those skilled in the art.

The thickness of the polymeric material is determined so as to satisfy uses and required physical properties. Usually, the thickness of the polymeric material is in the range of about 0.01 to about 1 mm, more preferably in the range of about 0.05 to about 0.25 mm.

The radiation sensitive or photosensitive resin composition according to the present invention include a photosensitive resin, including, for example, acrylate resins, polymethyl methacrylate resin, vinylchloride resins, polycarbonate resins, phenolic resins, epoxy resins and polyurethane resins, all in combination with a suitable photoinitiator such as benzoyl peroxide. Other suitable combinations of resins and photoinitiators would also be usable and are generally well known to those skilled in the art. One suitable photosensitive resin is a photosensitive acrylic resin composition. Preferably the photosensitive resin composition also comprises polymerizable monomers or oligomers. Other additives may also be added to the photosensitive resin composition, including, for example, antistatic agents, mold releasing agents and fluorine compounds for improving an antifouling property, by way of example and not limitation.

Irradiation by actinic energy is conducted, for example, by a medium-pressure mercury lamp. Although there is no particular restriction on the quantity of the light irradiation energy insofar as curing of the actinic energy ray curable composition occurs, the energy quantity is preferably 100 to 10,000 $mJ/cm^2$.

In one embodiment, the desired texture (i.e., steric structure) of the polymeric material has a short period that is not larger than the wavelength of visible light, which is less than about 400 nm. A period larger than 400 nm causes scattering of visible light and is therefore not suitable for an optical use such as an antireflection film. Thus, the conformally applied transparent conductive material will also have a short period that is less than 400 nm.

As the thickness of the ITO coating is increased, the coating becomes more conducting, while the transmission falls and the flexibility of the coating is also reduced. In addition, as the thickness of the coating is increased, the cost also rises because more material and more machine time is used. Thus, for efficient use of ITO and optimum performance, the thinnest possible coatings should be used to achieve the desired surface resistivity.

However, because the surface area of a nanostructured coating is much greater than that of a planar coating, a given amount of ITO will produce a significantly thinner coating, which can compromise the conductivity of the ITO layer. Therefore, it may be necessary to coat with more ITO to achieve the required conductivity. Thicker coatings may begin to fill in the nanostructures and limit the gains in anti-reflection. For these reasons, it is necessary to determine the necessary amount of ITO or other transparent conductive oxide to determine a suitable amount of ITO to produce the benefits in anti-reflection/transmission with enough added value to offset the additional cost involved in using additional coating material.

A typical range of ITO coating thickness is in the range of about 10 nm up to about 1 micron, preferably 50 to 500 nm. Layers thinner than 10 nm tend to become discontinuous, while layers thicker than about 1 micron become absorbing, stressed and expensive. The thickness range also has an impact on the surface resistivity. Thus, the thickness of the conformally applied ITO layer is preferably in the range of about 10 nm to about 750 nm, more preferably in the range of about 50 nm to about 500 nm. It is also desirable that the coating be at least substantially uniformly applied on the surface of the textured polymeric material such that the conformally applied coating is substantially the same thickness over the entirety of the coated surface.

The surface resistivity of the textured ITO layer can be varied between about 10 $\Omega$/sq to several thousand $\Omega$/sq, which makes ITO coatings suitable for a wide range of transparent EMC shielding and anti-static applications. In a preferred embodiment, the textured ITO layer exhibits a surface resistivity of between about 200 and about 600 $\Omega$/sq, more preferably a surface resistivity of between about 300 and about 500 $\Omega$/sq.

The visible transmission also falls as the ITO coating is made thicker. The textured ITO layer produced in the manner described herein preferably has a transmission of greater than about 90%, more preferably greater than about 93%, and most preferably greater than about 95%.

EXAMPLES

Example 1

Two sets of samples were prepared. The first set of samples comprised moth-eye nanostructured films and the second set of films comprised porous alumina films as set forth in copending patent application Ser. No. 12/834,180 to Hubbard et al., the subject matter of which is herein incorporated by reference in its entirety. Both sets of these films were coated with various thicknesses of ITO by sputtering and the results for total luminous transmission (TLT/%) are provided below:

| Thickness of Sputtered ITO layer | 100 nm | 300 nm |
|---|---|---|
| MothEye Nanostructured Film Type 1 [1] | 92.0 | 89.3 |
| MothEye Nanostructured Film Type 2 [2] | 92.6 | 90.4 |
| Porous Alumina Type Film [3] | 91.2 | 88.9 |
| Gloss PET film | 80.2 | 79.7 |

[1] Polyethylene terephthalate (PET) film with motheye nanostructured coating on the ITO sputtered surface, sold by MacDermid Autotype as Autoflex MothEye XMEE 180
[2] Polycarbonate film with motheye nanostructured coating on the ITO sputtered surface, sold by MacDermid Autotype as Autoflex MothEye MEC 180
[3] PET film with porous alumina type nanostructure coating on the ITO sputtered surface, as set forth in copending patent application Ser. No. 12/834,180 to Hubbard et al, the disclosure of which is incorporated herein by references in its entirety.

Example 2

Motheye nanostructured films were sputtered with ITO and were prepared to surface resistivities of 300 Ω/sq (thicker) and 500 Ω/sq (thinner) and the results for total luminous transmission (TLT/%) are provided below:

| Surface Resistivity | 300 Ω/sq (thicker) | 500 Ω/sq (thinner) |
|---|---|---|
| Gloss surface with ITO | 86.6% | 89.9% |
| Moth-eye surface with ITO | 94.3% | 95.3% |

These examples illustrate the improved transmission due to the nanostructure coating.

What is claimed is:

1. A method of applying a transparent conductive film to a polymeric substrate having a texture therein, the method comprising the steps of:
   a) providing a polymeric material having a texture disposed therein; and
   b) conformally applying a transparent conductive material to the polymeric material to produce a conformal transparent conductive film thereon;
   wherein the conformal transparent conductive film has a texture corresponding to the texture of the polymeric material;
   wherein the texture has a period that is not larger than the wavelength of visible light, whereby the conformal transparent conductive film is antireflective; and
   wherein the transparent conductive material is applied to the polymeric material by physical vapor deposition.

2. The method according to claim 1, wherein the transparent conductive material is applied to the polymeric material by sputtering.

* * * * *